United States Patent
Hatasa et al.

(10) Patent No.: US 9,521,758 B2
(45) Date of Patent: Dec. 13, 2016

(54) SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Keita Hatasa, Miyoshi (JP); Arata Harada, Gamagoori (JP); Daisuke Harada, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 16 days.

(21) Appl. No.: 14/280,935

(22) Filed: May 19, 2014

(65) Prior Publication Data

US 2014/0362540 A1    Dec. 11, 2014

(30) Foreign Application Priority Data

Jun. 5, 2013 (JP) ................................ 2013-118971

(51) Int. Cl.
| | |
|---|---|
| H05K 7/10 | (2006.01) |
| H05K 7/12 | (2006.01) |
| H05K 3/30 | (2006.01) |
| H01L 25/11 | (2006.01) |

(52) U.S. Cl.
CPC .............. *H05K 3/306* (2013.01); *H01L 25/11* (2013.01); *H01L 2924/0002* (2013.01); *H01L 2924/1203* (2013.01); *H01L 2924/13055* (2013.01); *H01L 2924/15787* (2013.01); *H01L 2924/181* (2013.01); *H05K 2201/10166* (2013.01); *H05K 2201/10409* (2013.01); *H05K 2201/10424* (2013.01); *H05K 2201/2027* (2013.01); *H05K 2203/167* (2013.01)

(58) Field of Classification Search
USPC .................................................. 361/767, 728
See application file for complete search history.

(56) References Cited

U.S. PATENT DOCUMENTS 8,107,255 B2 *   1/2012   Sakamoto et al. ............ 361/792

FOREIGN PATENT DOCUMENTS

| JP | 2010-146873 | * | 7/2010 | ............ H01R 13/64 |
|---|---|---|---|---|
| JP | A-2010-146873 | | 7/2010 | |
| JP | A-2013-38110 | | 2/2013 | |

\* cited by examiner

*Primary Examiner* — Andargie M Aychillhum
(74) *Attorney, Agent, or Firm* — Oliff PLC (57) ABSTRACT

A semiconductor device includes a semiconductor module that has an electrode terminal projecting externally; a substrate that has a through hole or a cut-out for inserting the electrode terminal; and a guide member that is provided between the semiconductor module and the substrate and guides the electrode terminal in such a manner that the electrode terminal is inserted into the through hole or the cut-out. The guide member becomes out of contact with the electrode terminal after the electrode terminal is inserted into the through hole or the cut-out.

14 Claims, 9 Drawing Sheets

SEMICONDUCTOR DEVICE

BACKGROUND OF THE INVENTION

1. Field of the Invention

The present invention relates to a semiconductor device.

2. Description of the Related Art

As a way of mounting an electronic component on a substrate, a method called "bottom entry" is known in which a contact pin (electrode terminal) of a connector is inserted from a side of a substrate having a pattern and the contact pin is electrically connected with the substrate. Specifically, for example, a technology is known in which a connector on which a contact pin is installed and a substrate in which an insertion hole for inserting the contact pin is provided are electrically connected by the method of "bottom entry" via a guide member in which a guide hole is formed. Note that the insertion hole formed in the substrate and the guide hole formed in the guide member are coincident in their positions.

In this technology, the guide hole formed in the guide member has such a shape that the diameter of the guide hole is gradually increased like a funnel along a direction toward the contact pin of the connector. Thereby, even when the position of the contact pin of the connector is shifted due to tolerance or the like, the contact pin of the connector is guided into the guide hole. As a result, it is possible to electrically connect the connector on which the contact pin is installed and the substrate in which the insertion hole for inserting the contact pin is provided via the guide member positively and rapidly according to the method of bottom entry.

PATENT REFERENCE

Japanese Laid-Open Patent Application No. 2010-146873

SUMMARY OF THE INVENTION

According to an aspect of the present invention, a semiconductor device includes a semiconductor module that has an electrode terminal projecting externally; a substrate that has a through hole or a cut-out for inserting the electrode terminal; and a guide member that is provided between the semiconductor module and the substrate and guides the electrode terminal in such a manner that the electrode terminal is inserted into the through hole or the cut-out. The guide member becomes out of contact with the electrode terminal after the electrode terminal is inserted into the through hole or the cut-out.

Other objects, features and advantages of the present invention will become more apparent from the following detailed description when read in conjunction with the accompanying drawings.

DETAILED DESCRIPTION OF THE EMBODIMENT

Below, using the accompanying drawings, the embodiment and the variant thereof according to the present invention will be described.

First, for the sake of convenience of explanation, an objective of the embodiment and the variant thereof will be described.

In the above-described technology, after the connector is mounted on the substrate via the guide member, the contact pin of the connector is in contact with the guide hole. Therefore, due to a vibration or the like, abrasion may occur between the contact pin of the connector and the guide hole. When abrasion occurs between the contact pin of the connector and the guide hole, a plating film formed on the contact pin of the connector, for example, may be removed, and as a result, connection reliability may be degraded. Especially for a substrate to be mounted in a vehicle, there is a serious concern that the above-mentioned problem occurs due to a vibration of the vehicle.

The embodiment and the variant thereof according to the present invention have been devised in consideration of the above-mentioned problem, and an objective of the present embodiment and the variant thereof is to provide a semiconductor device that has a guide member which guides an electrode terminal into a through hole or a cut-out formed in the substrate while being in contact with the electrode terminal and becomes out of contact with the electrode terminal after the guiding.

In the embodiment and the variant thereof, it is possible to provide a semiconductor device that has a guide member which guides an electrode terminal into a through hole or a cut-out formed in the substrate while being in contact with the electrode terminal and becomes out of contact with the electrode terminal after the guiding.

Below, using the drawings, the embodiment and the variant thereof according to the present invention will be described. Note that in the respective drawings, the same reference numerals may be given to the same elements and duplicate description may be omitted.

First Embodiment

Figure 1:
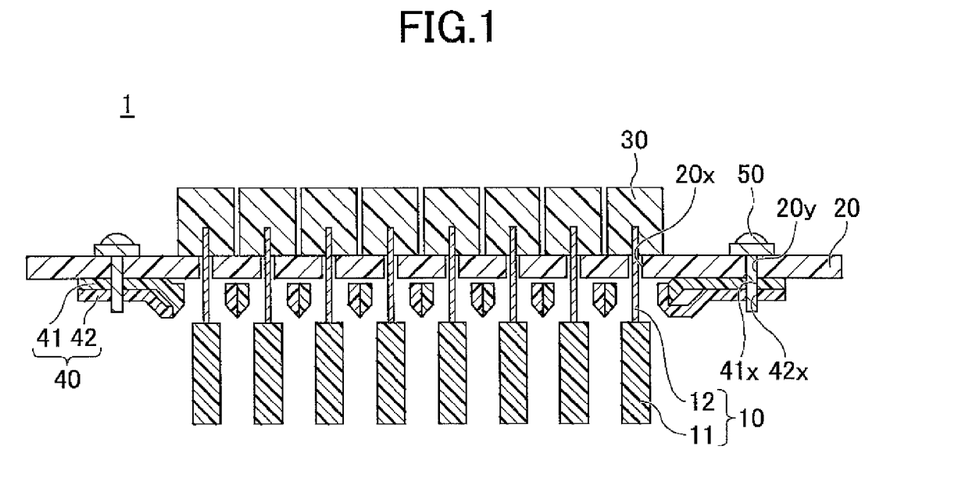
FIG. 1 is a sectional view illustrating a semiconductor device according to a first embodiment.
Figure 2A:
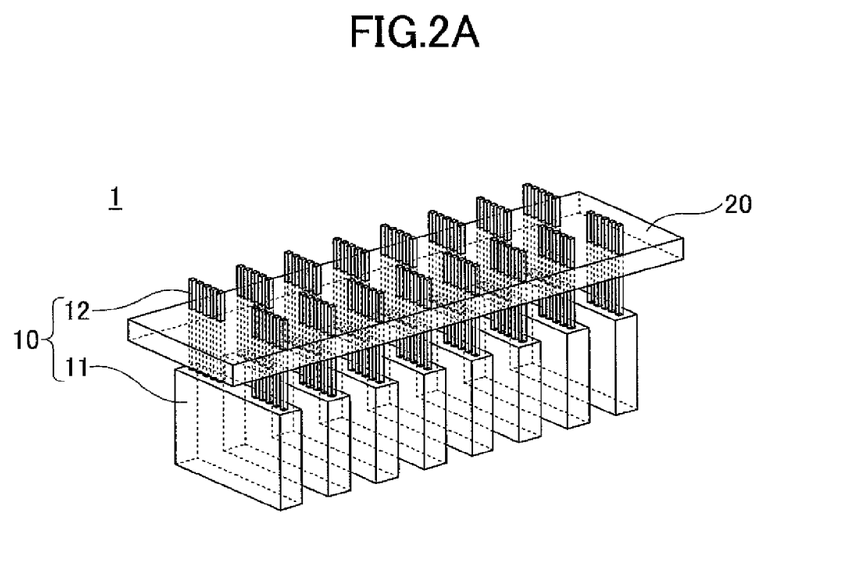
FIG. 2A is a perspective view illustrating the semiconductor device according to the first embodiment.

FIG. 1 is a sectional view illustrating a semiconductor device according to the first embodiment. FIG. 2A is a perspective view illustrating the semiconductor device according to the first embodiment. However, FIG. 2A shows only semiconductor modules 10 and a substrate 20 shown in FIG. 1 and the other members are omitted.

As shown in FIGS. 1 and 2A, the semiconductor device 1 has a plurality of the semiconductor modules 10 (eight modules 10 in the first embodiment), the substrate 20, connectors 30, a guide member 40 and fastening members 50. However, it is not necessary to provide a plurality of semiconductor modules 10. At least one semiconductor module 10 is needed.

Each semiconductor module 10 has a sealing part 11 and a plurality of electrode terminals 12 (ten terminals 12 in the first embodiment). In the sealing part 11, a semiconductor element (not shown) is sealed. The semiconductor element is, for example, a power switching device such as an Insulated Gate Bipolar Transistor (IGBT), a freewheeling diode, or the like, to be used in an inverter circuit for being mounted in a vehicle.

The electrode terminals 12 are electrically connected with, for example, the semiconductor element via bonding wires (not shown) in the sealing part 11. The electrode terminals 12 are, for example, pin-like (slender) conductive members made of copper, alloy 42 or the like. Parts of the electrode terminals 12 project externally from the sealing part 11. On the surfaces of the electrode terminals 12, plating films such as gold, palladium, nickel, and/or the like, can be formed.

A cross section of each electrode terminal 12 taken along a direction perpendicular to the longitudinal direction thereof can have a rectangular shape. However, a cross section of each electrode terminal 12 taken along the direction perpendicular to the longitudinal direction thereof is not limited thereto and can have any shape such as a circular shape, an elliptic shape, a polygonal shape or the like.

The substrate 20 is a part in which the respective semiconductor modules 10 are mounted. On the substrate 20, circuits for driving the respective semiconductor modules 10 are formed. As the substrate 20, it is possible to use a so-called "glass epoxy" substrate obtained from impregnating an insulating resin such as an epoxy-based resin in a glass cloth, a silicon substrate, a ceramic substrate, or the like. A plurality of interconnection layers can be provided in the substrate 20.

Figure 2B:
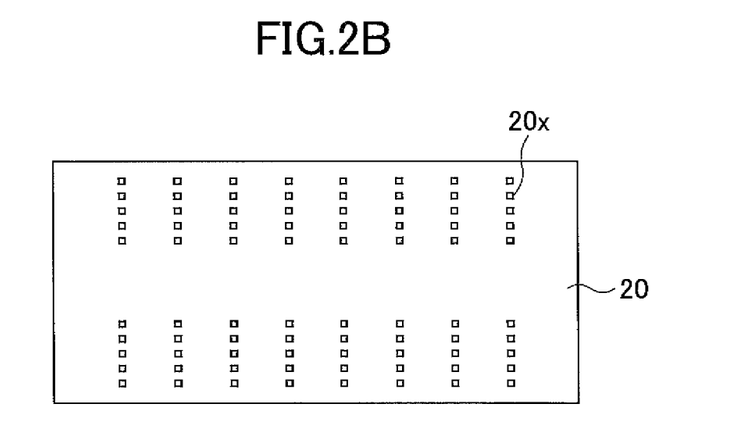
FIG. 2B is a plan view illustrating a substrate shown in FIGS. 1 and 2A in a case where through hole 20x are formed.
Figure 2C:
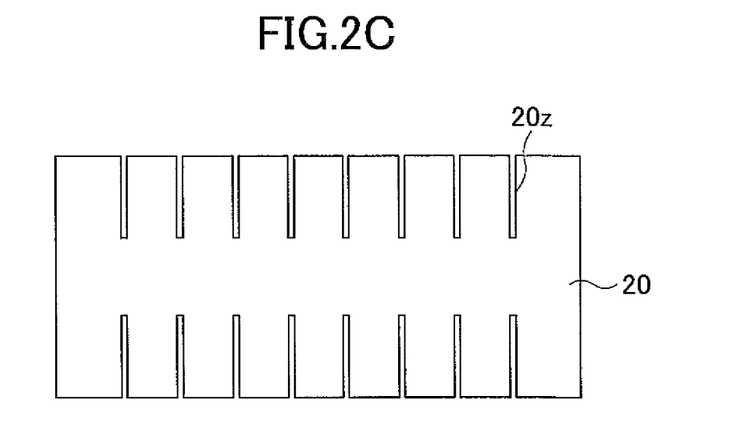
FIG. 2C is a plan view illustrating the substrate shown in FIGS. 1 and 2A in a case where cut-outs 20z are formed instead of the through holes 20x.

In the substrate 20, a plurality of through holes 20x are formed for inserting the respective electrode terminals of each semiconductor module 10. A plan view of each through hole 20x can be a rectangular shape (see FIG. 2B) or a circular shape so as to correspond to a sectional shape of each electrode terminal 12 taken along a direction perpendicular to the longitudinal direction. In order to make it possible to insert each electrode terminal 12, the plan view of each through hole 20x has a sectional shape larger than a sectional shape of each electrode terminal 12 taken along a direction perpendicular to the longitudinal direction. Accordingly, the inner wall surface of each through hole 20x and the side wall surface of the corresponding electrode terminals 12 do not come into contact with each other. Note that the through holes 20x can be, instead, replaced by cut-outs 20z, respectively, as shown in FIG. 2C. In this case, each cut-out 20z has such a structure that the corresponding electrode terminals 12 can be inserted thereinto.

The connectors 30 are mounted on one side of the substrate 20. Terminals (not shown) of the connectors 30 are electrically connected with the circuits formed in the substrate 20. Into the connectors 30, the electrode terminals 12 of the semiconductor modules 10 are inserted from the other side of the substrate 20 via the through holes 20x. Thereby, the semiconductor elements in the sealing parts 11 of the semiconductor modules 10 are electrically connected with the circuits formed in the substrate 20 via the connectors 30.

Note that spring structures can be provided at parts of the connectors 30 connected with the electrode terminals 12. Thereby, even when the semiconductor device 1 is vibrated, the spring structures can absorb the vibration, and thus, it is possible to improve connection reliability between the connectors 30 and the electrode terminals 12.

The guide member 40 is inserted between the semiconductor modules 10 and the substrate 20 and guides the electrode terminals 12 of the semiconductor modules 10 in such a manner that the electrode terminals 12 are inserted into the through holes 20x of the substrate 20.

Figure 5A:
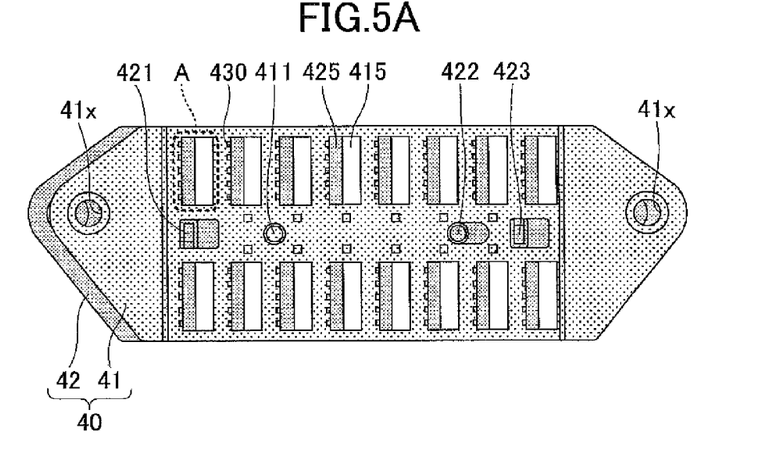
Figure 5B:
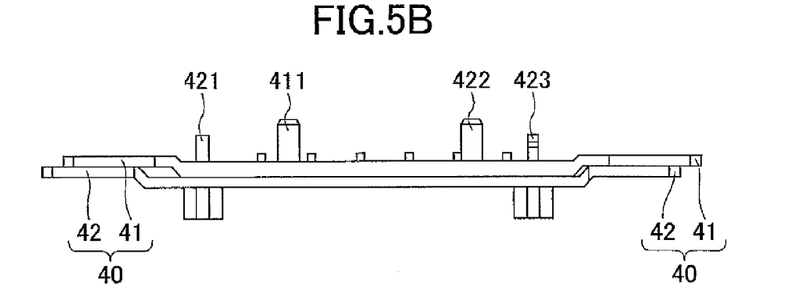
Figure 5C:
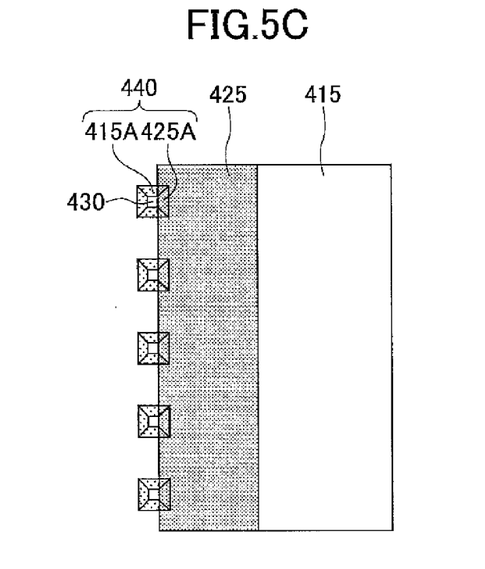
Figure 5D:
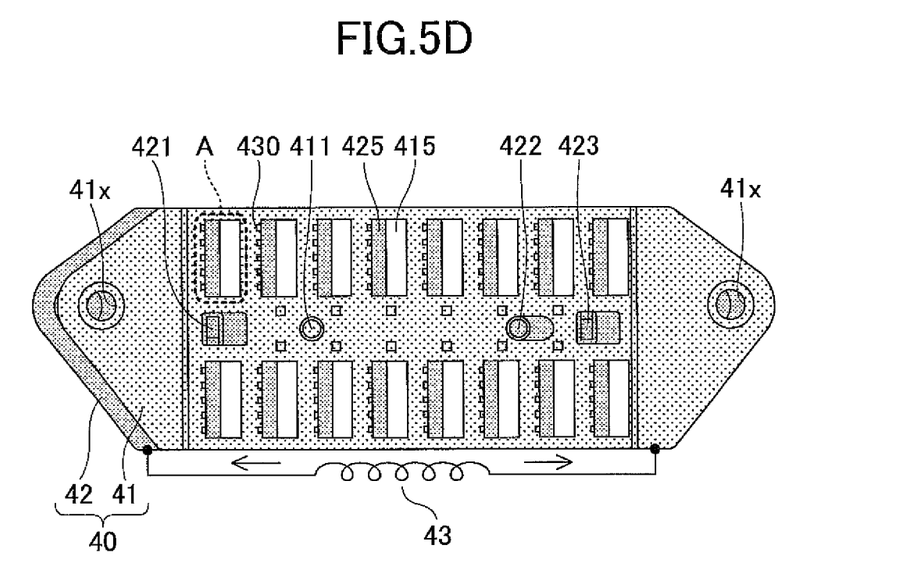
Figure 6A:
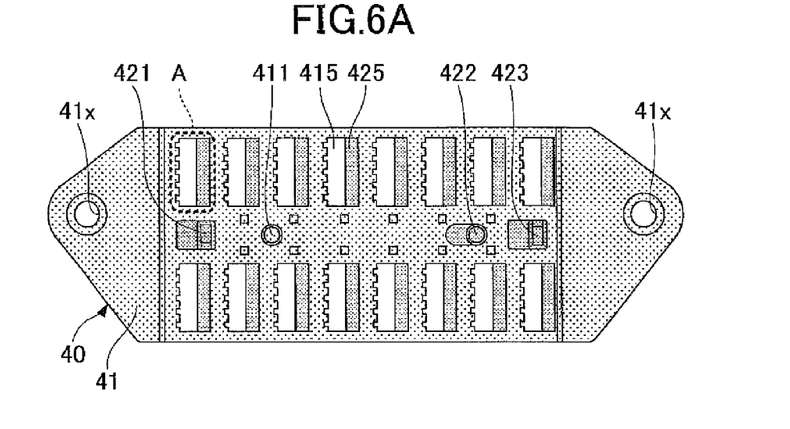
Figure 6B:
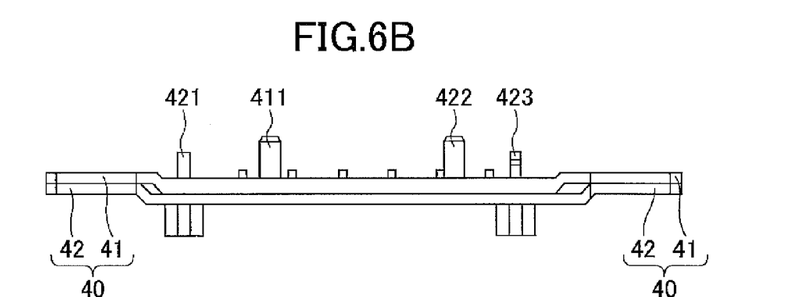
Figure 6C:
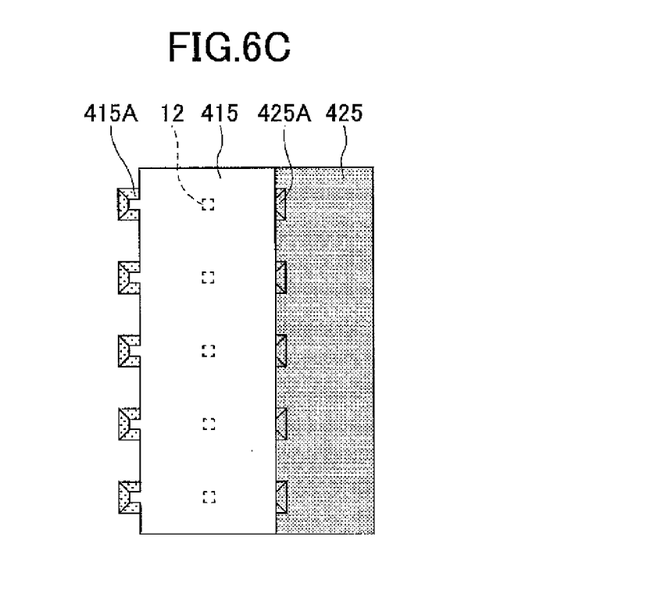
Figure 6D:
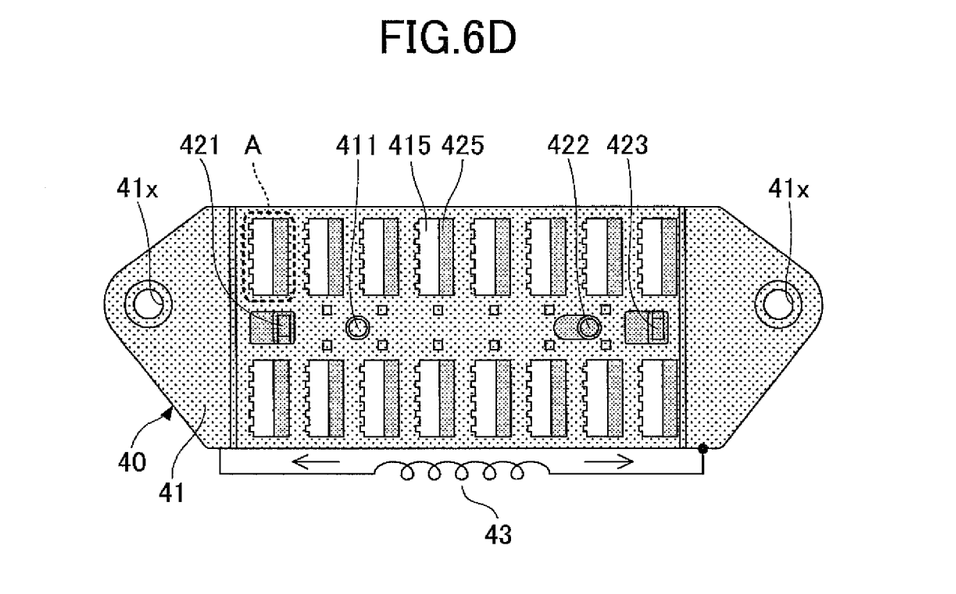

The guide member 40 includes a first member 41 and a second member 42 each of which is movable (slidable) with respect to the substrate 20. As a material of the first member 41 and the second member 42, an insulating resin can be used, for example. As the first member 41 and the second member 42, members obtained from coating the surfaces of metal members with insulating coatings can be used, respectively. Note that the moving (sliding) of the first member 41 and the second member 42 can be carried out manually or can be carried out automatically using a predetermined apparatus; or such a mechanism can be provided that the sliding is carried out by a reaction force of a spring or the like. That is, an elastic member such as a spring can be inserted connecting the first member 41 and the second member 42. FIGS. 5D and 6D illustrate an example thereof. As shown in FIGS. 5D and 6D, a spring 43 is inserted between the first member 41 and the second member 42 and the spring 43 exerts such a reaction force to move (slide) the first member 41 and the second member 42 with respect to one another.

Fastening holes 41x are formed in the first member 41 and fastening holes 42x are formed in the second member 42. Further, fastening holes 20y are formed in the substrate 20 for fastening the first member 41 and the second member 42. The fastening members 50 are inserted into the fastening holes 41x, the fastening holes 42x and the fastening holes 20y, respectively, so that the first member 41 and the second member 42 are fastened to the substrate 20, as shown in FIG. 1.

In a state of FIG. 1 (the electrode terminals 12 are already inserted into the through holes 20x), the electrode terminals 12 and the guide member 40 are not in contact with each other. In other words, such a design is made that, when the electrode terminals 12 are inserted into the through holes 20x, the electrode terminals 12 and the guide member 40 become out of contact with each other, the fastening holes 41x, and the fastening holes 42x and the fastening holes 20y become coincident in plan view so that the fastening members 50 can be inserted thereinto, respectively.

Note that the semiconductor device 1 includes a pin structure, a spring mechanism or a button-type opening/closing mechanism for opening and closing the guide member 40.

Figure 3A:
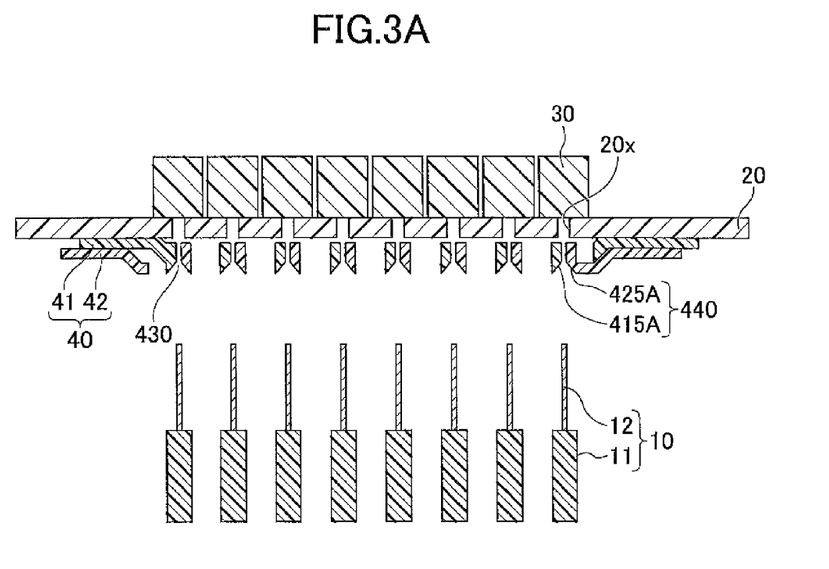
FIGS. 3A, 3B, 4A, 4B, 5A, 5B, 5C, 5D, 6A, 6B, 6C and 6D illustrate a structure and a function of a guide member according to the first embodiment.

Here, also using FIGS. 3A to 6D in addition to FIGS. 1 to 2C, a structure and a function of the guide member 40 will be described in detail. First, as shown in FIG. 3A, the substrate 20 is prepared in which the connectors 30 are mounted and the guide member 40 are temporarily fastened. Note that FIGS. 5A to 5D shows the guide member 40 in the state of FIG. 3A. FIG. 5A is a plan view (top view), FIG. 5B is a front view and FIG. 50 is a magnified partial bottom view showing a part "A" in FIG. 5A. Further, in FIG. 5A and FIG. 5C, for the purpose of convenience, the first member 41 and the second member 42 are expressed by halftone-dot patterns having different dot densities.

As shown in FIGS. 5A and 5B, a projection (column) 411 is provided on the first member 41 projecting toward the substrate 20 (omitted in FIGS. 3A, 3B, 4A and 4B). Further, projections 421 to 423 (columns) are formed on the second member 42 projecting toward the substrate through long holes formed in the first member 41 (omitted in FIGS. 3A, 3B, 4A and 4B).

The projections 411 and 421 to 423 are inserted into long holes (not shown) formed in the substrate 20. Thereby, the first member 41 and the second member 42 are temporarily fastened to the substrate 20 in such a state that they can move independently (slidable) with respect to the substrate 20 and the state shown in FIG. 3A is obtained. At this time, the projections 421 to 423 position the first member 41 and the second member 42 to one another, and thus, the positional accuracy between the first member 41 and the second member 42 can be ensured.

Further, the projections 421 to 423 position the first member 41 and the second member 42 to the substrate 20. Note that at least one of the projections 421 to 423 is so long that the projection projects from the top surface of the substrate 20.

In the first member 41, two openings 415 are provided for each semiconductor module 10. Further, on the second member 42, two projections 425 are provided for each semiconductor module 10 and are inserted into the openings 415, respectively.

In FIGS. 3A and 5A to 5C, the respective opening 415 and the respective projection 425 are relatively moved (slid) so that each projection 425 is at the left end, in the drawings, in the corresponding opening 415. Thereby, as shown in FIGS. 3A and 5A to 5C, each opening 415 and the corresponding projection 425 are joined together so that, for each electrode terminal 12, one corresponding insertion hole 430 to which the electrode terminal 12 is inserted is formed. Such a design is made that, at this time, each insertion hole 430 and the corresponding through hole 20x of the substrate 20 are coincident with one another in position.

An inclined part 415A is formed at a part of the periphery of each insertion hole 430 at a bottom side of each opening 415. The inclined part 415A is inclined so that the insertion hole 430 becomes wider toward the bottom. Also, an inclined part 425A is formed at another part of the periphery of each insertion hole 430 at the bottom side of each projection 425. The inclined part 425A is inclined so that the insertion hole 430 becomes wider toward the bottom. The inclined part 415A and the inclined part 425A form a guiding part 440 at the periphery of each insertion hole 430 for guiding the corresponding electrode terminal 12. Each guiding part 440 has a tapered shape wider toward the bottom side from which the electrode terminal 12 is inserted.

Thus, before each electrode terminal 12 is inserted into the corresponding through hole 20x, the first member 41 and the second member 42 are moved in predetermined directions. As a result, the openings 415 of the first member 41 and the projections 425 of the second member 42 are joined to form the guiding parts 440 having the inclined parts 415A and 425A.

Figure 3B:
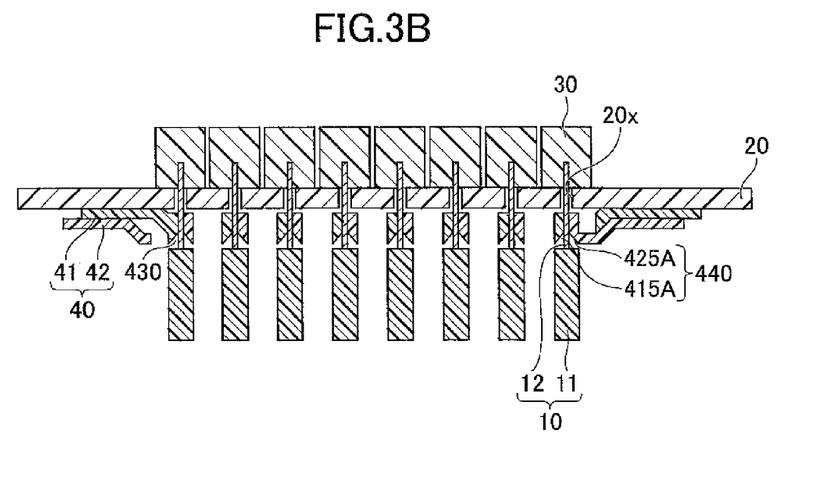

Next, as shown in FIG. 3B, the respective electrode terminals 12 are inserted into the corresponding insertion holes 430 of the guide member 40. As described above, the guiding part 440 having the tapered shape is formed in the periphery of each insertion hole 430. Therefore, it is possible to easily guide each electrode terminal 12 into the corresponding insertion hole 430. Further, the guiding part 440 comes into contact with the electrode terminal 12 and guides the electrode terminal 12 in such a manner that the electrode terminal 12 is inserted into the through hole 20x. As a result, each electrode terminal 12 is inserted into the connector 30 through the through hole 20x of the substrate 20.

Figure 4A:
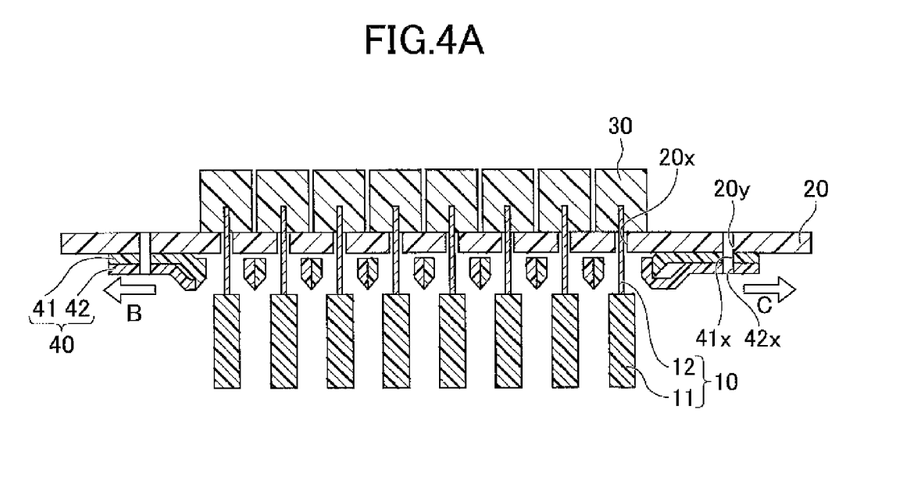

Next, as shown in FIG. 4A, with respect to the substrate 20, the first member 41 of the guide member 40 is moved (slid) in a direction of an arrow B and the second member 42 of the guide member 40 is moved (slid) in a direction of an arrow C. Note that FIGS. 6A to 6D show the guide member 40 in a state of FIG. 4A. FIG. 6A is a plan view (top view), FIG. 6B is a front view and FIG. 6C is a magnified partial bottom view showing a part "A" in FIG. 6A. Further, in FIG. 6A and FIG. 6C, for the purpose of convenience, the first member 41 and the second member 42 are expressed by the halftone-dot patterns same as those in FIGS. 5A and 5C.

As shown in FIGS. 6A to 6C, as the respective openings 415 and the respective projections 425 are relatively moved (slid) in the directions shown in FIG. 4A, each projection 425 is at the right end of the corresponding opening 415 shown in the drawings. As a result, the electrode terminals 12 and the guide members 40 become out of contact with each other. Note that, in FIG. 6C, the position of the respective electrode terminals 12 are shown by broken lines.

Thus, after the respective electrode terminals 12 are inserted into the corresponding through holes 20x, the first member 41 and the second member 42 are moved in the directions opposite to those in the case of FIG. 3A. Thereby, the inclined parts 415A of the openings 415 in the first member 41 and the inclined parts 425A of the projections 425 in the second member 42 become apart from each other. Thus, the guiding parts 440 each having the inclined parts 415A and 425A become out of contact with the electrode terminals 12, respectively.

Figure 4B:
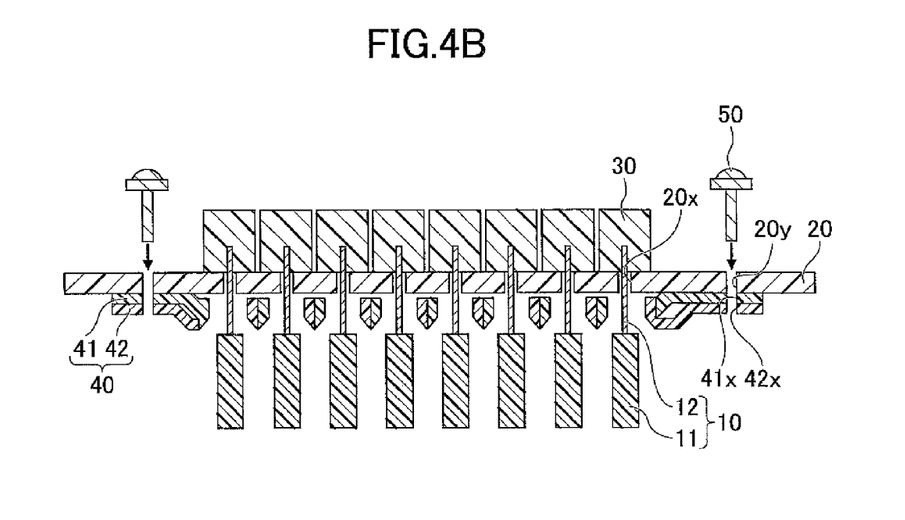

Next, as shown in FIG. 4B, the fastening members 50 are inserted into the fastening holes 41x of the first member 41, the fastening holes 42x of the second member 42 and the fastening holes 20y of the substrate 20, and thus, the first member 41 and the second member 42 are fastened to the substrate 20. Note that although, in FIGS. 3A and 3B, the fastening holes 41x, 42x and 20y are not shown, they are different in position from each other in the state of FIGS. 3A and 3B.

Thus, in the semiconductor device 1 according to the first embodiment, the guide member 40 is provided between the semiconductor modules 10 and the substrate 20. The guide member 40 guides the electrode terminals 12 of the semiconductor modules 10 in such a manner that the electrode terminals 12 are inserted into the through holes 20x formed in the substrate 20, respectively. The guide member 40 has the guiding parts 440 that come into contact with the electrode terminals 12 and guide the electrode terminals 12 in such a manner that the electrode terminals 12 are inserted into the through holes 20x, respectively. The guiding parts 440 become out of contact with the electrode terminals 12 after the electrode terminals 12 are thus inserted into the through holes 20x, respectively. Thereby, it is possible to rapidly and positively insert the electrode terminals 12 of the semiconductor modules 10 into the through holes 20x formed in the substrate 20. Also, it is possible to improve the connection reliability of the electrode terminals 12.

That is, since the guiding parts 440 of the guide member 40 become out of contact with the electrode terminals 12 after the electrode terminals 12 are inserted into the through holes 20x, there is no likelihood of abrasion otherwise being able to occur between the electrode terminals 12 and the guiding parts 440 due to a vibration or the like. As a result, it is possible to avoid degradation in connection reliability otherwise being able to occur as a result of, for example, the plating films formed on the electrode terminals 12 being removed, and thus, it is possible to improve the connection reliability of the electrode terminals 12.

Further, since the guiding parts 440 become out of contact with the electrode terminals 12 after the electrode terminals 12 are inserted into the through holes 20x, it is possible to ensure an insulation distance between the electrode terminals 12 and the guiding parts 440.

Thus, the guiding parts 440 become out of contact with the electrode terminals 12 after the electrode terminals 12 are inserted into the through holes 20x. At this time, several millimeters or the like are sufficient as the space between each electrode terminal 12 and the corresponding guiding part 440. Therefore, it is possible to position the electrode terminals 12 within a narrow space.

Variant of First Embodiment

In the variant of the first embodiment, guiding parts have structures, in one example, different from those of the first embodiment. Note that for the variant of the first embodiment, description for the same elements as those of the first embodiment will be omitted.

Figure 7A:
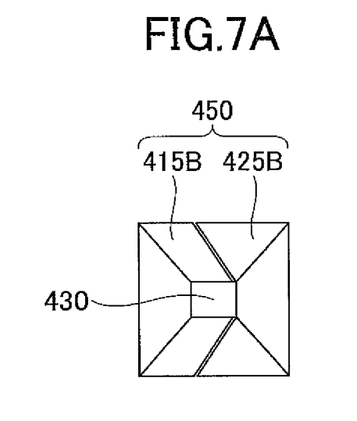
FIGS. 7A and 7B illustrate a guiding part in a variant of the first embodiment.
Figure 7B:
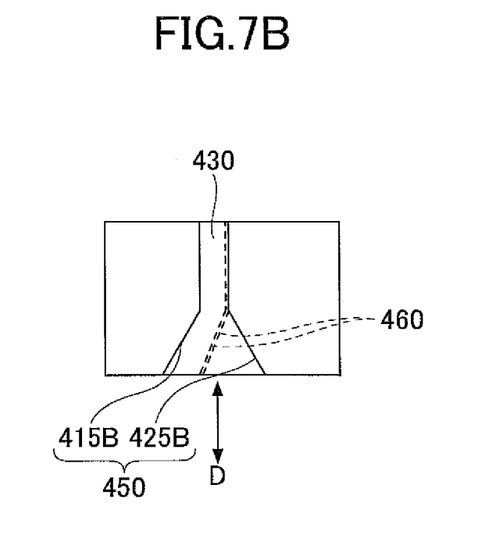

FIGS. 7A and 7B illustrate a guiding part in the variant of the first embodiment and illustrate the same state as that in FIG. 3A of the first embodiment. FIG. 7A shows a bottom view and FIG. 7B shows a side view.

As shown in FIGS. 7A and 7B, an inclined part 415B is formed at a periphery of each insertion hole 430 at a bottom side of each opening 415. The inclined part 415B is inclined so that the insertion hole 430 becomes wider toward the bottom. Also, an inclined part 425B is formed at another part of the periphery of each insertion hole 430 at the bottom side of each projection 425. The inclined part 425B is inclined so that the insertion hole 430 becomes wider toward the bottom. The inclined part 4153 and the inclined part 425B form the guiding part 450 at the periphery of each insertion hole 430 for guiding the corresponding electrode terminal 12. Each guiding part 450 has a tapered shape wider toward the bottom side from which the electrode terminal 12 is inserted.

In FIG. 7B, a reference numeral 460 denotes contact surfaces at which the inclined parts 415B and 425B come into contact with one another. The contact surfaces 460 are inclined by a predetermined angle with respect to a direction D perpendicular to the surface of the substrate 20 on which the through holes 20x are formed. The predetermined angle is preferably larger than an angle at which the electrode terminal 12 is inserted.

For example, the angle at which the electrode terminal 12 is inserted is ideally 0 degrees with respect to the direction D (i.e., ideally parallel to the direction D). However, actually, it is expected that an angle at which the electrode terminal 12 is inserted is shifted by 7 to 8 degrees or the like with respect to the direction D. In this case, it is preferable to determine the predetermined angle to be larger than the 7 to 8 degrees or the like, for example, greater than or equal to 10 degrees.

Figure 8A:
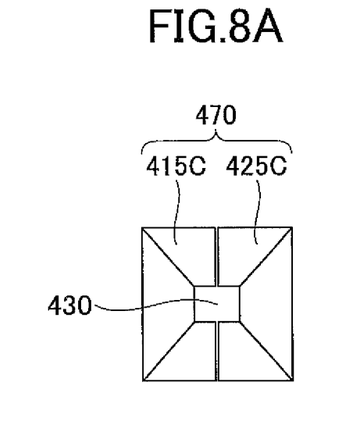
FIGS. 8A and 8B illustrate a guiding part in a comparison example.
Figure 8B:
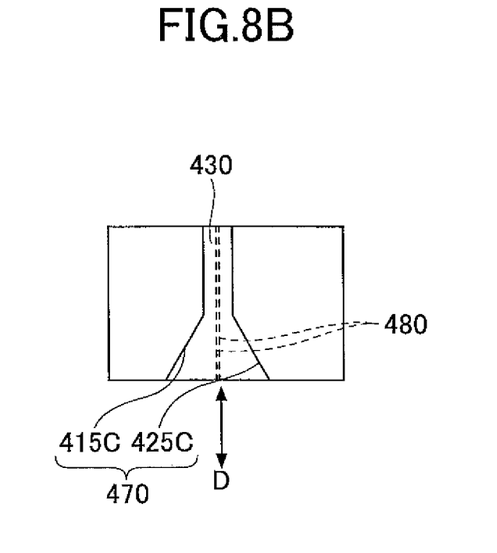

Below, using a comparison example, advantageous effects of the structure shown in FIGS. 7A and 7B will be described. FIGS. 8B and 8B illustrate a guiding part in a comparison example and illustrate the same state as that of FIG. 3A of the first embodiment. FIG. 8A shows a bottom view and FIG. 85 shows a side view.

As shown in FIGS. 8A and 85, instead of the guiding part 450 including the inclined parts 415B and 4253 of FIGS. 7A and 7B, a guiding part 470 including inclined parts 4150 and 425C is provided. However, different from the case of FIGS. 7A and 7B, contact surfaces 480 are set in parallel to the direction D.

In FIGS. 8A and 8B, assuming that a groove is present between the inclined parts 415C and 425C, the leading end of the electrode terminal 12 can erroneously enter the groove when the electrode terminal 12 is inserted. If so, the electrode terminal 12 may lodge in the groove and be unable to be guided into the insertion hole 430. This is because, in the structure of FIGS. 8A and 8B, no force is generated to cause the electrode terminal 12 to move toward the insertion hole 430 when the leading end of the electrode terminal 12 erroneously enters the groove.

In contrast thereto, according to the structure of FIGS. 7A and 7B, the contact surfaces 460 are inclined with respect to the direction D. Therefore, even when a groove is present between the inclined parts 415B and 425B and the leading end of the electrode terminal 12 erroneously enters the groove, the electrode terminal 12 does not lodge in the groove and is guided into the insertion hole 430 along the inclination of the contact surfaces 460. This is because, since the contact surfaces 460 are inclined, a force is generated to cause the electrode terminal 12 to move toward the insertion hole 430 even when the leading end of the electrode terminal 12 erroneously enter the groove.

Note that, although, ideally, no groove can be present between the inclined parts 415B and 425B and between the inclined parts 415C and 425C, such a groove may be present due to a variation in sizes of parts/components or the like. Even in such a case, by using the configuration of FIGS. 7A and 7B, the contact surfaces 460 are inclined with respect to the direction D and thus the electrode terminal 12 does not lodge in the groove. As a result, it is possible to properly guide the electrode terminal 12 into the insertion hole 430 along the inclination of the contact surfaces 460.

Thus, the preferable embodiment (first embodiment) and the variant thereof have been described. However, the present invention is not limited to the first embodiment and the variant thereof, and variations, modifications and/or replacements can be made on the first embodiment and the variant thereof without departing from the scope of the present invention.

For example, in the first embodiment and the variant thereof, such a configuration is provided that after the electrode terminal 12 is inserted into the through hole 20x, the first member 41 and the second member 42 are moved (slid) in predetermined directions, and thereby, the guiding part 440 becomes out of contact with the electrode terminal 12. However, the present invention is not limited to such a sliding mechanism, as long as, after the electrode terminal 12 is inserted into the through hole 20x, the guiding part 440 becomes out of contact with the electrode terminal 12.

For example, as the first member 41 and the second member 42, a resin that deforms when it has a temperature greater than or equal to a predetermined temperature can be used. Then, such a structure, for example, can be provided that after the electrode terminal 12 is inserted into the through hole 20x, the first member 41 and the second member 42 can be heated to have a temperature greater than or equal to the predetermined temperature and thereby, the guiding part 440 becomes out of contact with the electrode terminal 12.

Further, in the first embodiment and the variant thereof, the guide member 40 is fastened to the substrate 20, as one example. However, as long as the guide member 40 is fastened in a state of being out of contact with the electrode terminal 12, the guide member 40 is not necessarily fastened to the substrate 20. For example, in a case where the substrate 20 is fastened to a housing or the like, the guide member 40 can be directly fastened to the housing or the like in a state of being out of contact with the electrode terminal 12.

Further, in the first embodiment and the variant thereof, the two members join together to form the guiding part. However, three or more members can join together to form a guiding part.

The present application is based on and claims the benefit of priority of Japanese Priority Application No. 2013-118971, filed on Jun. 5, 2013, the entire contents of which are hereby incorporated herein by reference.

What is claimed is:

1. A semiconductor device comprising: a semiconductor module that has an electrode terminal projecting externally; a substrate that has a through hole or a cut-out for inserting the electrode terminal; and a guide member that is provided between the semiconductor module and the substrate and guides the electrode terminal in such a manner that the electrode terminal is inserted into the through hole or the cut-out, wherein the guide member is not in contact with the electrode terminal after insertion of the electrode terminal is inserted into the through hole or the cut-out, wherein the guide member includes a plurality of members movable with respect to the substrate, before the electrode terminal is inserted into the through hole or the cut-out, the respective ones of the plurality of members move in predetermined directions and form the guiding part as a result of joining together, and after the electrode terminal is inserted into the through hole or the cut-out, the respective ones of the plurality of members move in directions opposite to the predetermined directions and move away from each other so that the guiding part becomes out of contact with the electrode terminal.

2. The semiconductor device as claimed in claim 1, wherein
the guide member includes a guiding part that guides the electrode terminal while being in contact with the electrode terminal in such a manner that the electrode terminal is inserted into the through hole or the cut-out, wherein
the guiding part becomes out of contact with the electrode terminal after the electrode terminal is inserted into the through hole or the cut-out.

3. The semiconductor device as claimed in claim 1, wherein
the guiding part has a tapered shape such that an end at which the electrode terminal is inserted is wider than an opposite end.

4. The semiconductor device as claimed in claim 3, wherein
contact surfaces on which the respective ones of the plurality of members come into contact with each other when joining together are inclined with respect to a direction perpendicular to a surface of the substrate on which the through hole or the cut-out is formed.

5. The semiconductor device as claimed in claim 4, further comprising
the plurality of members are positioned with respect to each other.

6. The semiconductor device as claimed in claim 5, wherein
an elastic member is provided connecting the plurality of members.

7. The semiconductor device as claimed in claim 3, further comprising
the plurality of members are positioned with respect to each other.

8. The semiconductor device as claimed in claim 7, wherein
an elastic member is provided connecting the plurality of members.

9. The semiconductor device as claimed in claim 1, wherein
contact surfaces on which the respective ones of the plurality of members come into contact with each other when joining together are inclined with respect to a direction perpendicular to a surface of the substrate on which the through hole or the cut-out is formed.

10. The semiconductor device as claimed in claim 9, further comprising
the plurality of members are positioned with respect to each other.

11. The semiconductor device as claimed in claim 10, wherein
an elastic member is provided connecting the plurality of members.

12. The semiconductor device as claimed in claim 1, further comprising
the plurality of members are positioned with respect to each other.

13. The semiconductor device as claimed in claim 12, wherein
an elastic member is provided connecting the plurality of members.

14. A semiconductor device comprising:
a semiconductor module having an electrode terminal projecting externally;
a substrate having a through hole or a cut-out configured to receive the electrode terminal; and a guide member provided between the semiconductor module and the substrate, the guide member being configured to guide the electrode terminal into the through hole or the cut-out by aligning the electrode terminal in a direction of an opening of the through hole or the cut-out in response to the electrode terminal being inserted into the through-hole or cut-out, and, the guide member is not in contact with the electrode terminal after insertion of the electrode terminal into the through hole or the cut-out; wherein the guide member includes a plurality of members movable with respect to the substrate, before the electrode terminal is inserted into the through hole or the cut-out, the respective ones of the plurality of members move in predetermined directions and form the guiding part as a result of joining together, and after the electrode terminal is inserted into the through hole or the cut-out, the respective ones of the plurality of members move in directions opposite to the predetermined directions and move away from each other so that the guiding part becomes out of contact with the electrode terminal.

\* \* \* \* \*